US 8,698,167 B2

(12) United States Patent
Kim et al.

(10) Patent No.: US 8,698,167 B2
(45) Date of Patent: Apr. 15, 2014

(54) LIGHT SENSOR AND DISPLAY APPARATUS HAVING THE SAME

(75) Inventors: Woongkwon Kim, Cheonan-si (KR); Daecheol Kim, Hwaseong-si (KR); Ki-Hun Jeong, Cheonan-si (KR); SungHoon Yang, Seoul (KR); Yunjong Yeo, Seoul (KR); Sang Youn Han, Seoul (KR); Sungryul Kim, Asan-si (KR); Suk Won Jung, Goyang-si (KR); Byeonghoon Cho, Seoul (KR); HeeJoon Kim, Asan-si (KR); Hong-Kee Chin, Suwon-si (KR); Kyung-Sook Jeon, Yongin-si (KR); Seungmi Seo, Seoul (KR); Kyung-ho Park, Cheonan-si (KR); Jung suk Bang, Guri-si (KR); Kun-Wook Han, Seongnam-si (KR); Mi-Seon Seo, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 107 days.

(21) Appl. No.: 13/226,980

(22) Filed: Sep. 7, 2011

(65) Prior Publication Data

US 2012/0138960 A1   Jun. 7, 2012

(30) Foreign Application Priority Data

Dec. 6, 2010   (KR) .................. 10-2010-0123789

(51) Int. Cl.
  *H01L 27/15*   (2006.01)
(52) U.S. Cl.
  USPC ................. 257/80; 136/244; 349/1; 438/24

(58) Field of Classification Search
  USPC ............... 257/59, 72, 80–85; 136/244; 349/1
  See application file for complete search history.

(56) References Cited

U.S. PATENT DOCUMENTS

| 5,160,836 | A | * | 11/1992 | Miyake ................... 250/208.1 |
| 6,087,648 | A | * | 7/2000 | Zhang et al. ............... 250/208.1 |
| 6,445,003 | B1 | * | 9/2002 | Chang et al. ..................... 257/59 |
| 6,953,978 | B2 | * | 10/2005 | Chang et al. ................... 257/432 |
| 7,255,451 | B2 | * | 8/2007 | McCabe et al. ................. 359/605 |
| 2008/0049004 | A1 | * | 2/2008 | Kunimori et al. ............. 345/207 |
| 2009/0296032 | A1 | * | 12/2009 | Tago ................................ 349/116 |
| 2010/0032665 | A1 | | 2/2010 | Yamazaki et al. |
| 2010/0330713 | A1 | * | 12/2010 | Lee et al. ........................ 438/24 |
| 2011/0012115 | A1 | * | 1/2011 | Jeon et al. ....................... 257/59 |
| 2011/0242440 | A1 | * | 10/2011 | Noma et al. ....................... 349/1 |

FOREIGN PATENT DOCUMENTS

| JP | 11-261097 | | 9/1999 |
| JP | 2004-200651 | | 7/2004 |
| KR | 1019990057406 | | 7/1999 |
| WO | WO2010084641 | * | 7/2010 |

* cited by examiner

*Primary Examiner* — Mark Tornow
(74) *Attorney, Agent, or Firm* — H.C. Park & Associates, PLC (57) ABSTRACT

In a display apparatus, a light sensor of a display includes a light sensing layer, a source electrode, a drain electrode, an insulating layer, and a gate electrode to sense light from an external source. The light sensing layer is disposed on the substrate to sense light, and the source and drain electrodes are disposed on the light sensing layer and are covered by the insulating layer. The gate electrode is disposed on the insulating layer. An edge of the gate electrode is disposed on the light sensing layer at least in an area where the light sensing layer is overlapped with the source and drain electrodes.

18 Claims, 9 Drawing Sheets

LIGHT SENSOR AND DISPLAY APPARATUS HAVING THE SAME

CROSS REFERENCE TO RELATED APPLICATION

This application claims priority from and the benefit of Korean Patent Application No. 10-2010-0123789, filed on Dec. 6, 2010, the contents of which are herein incorporated by reference in its entirety.

BACKGROUND OF THE INVENTION

1. Field of the Invention

Exemplary embodiments of the present invention relate to a light sensor and a display apparatus having the same. More particularly, the present invention relates to a light sensor built in a display panel to prevent a circuit from being shorted and production of leakage current and also relates to a display apparatus having the light sensor.

2. Discussion of the Background

An image display device having a touch panel is widely used since an additional input device connected to the image display device for its operation, such as a keyboard or a mouse, is not required.

The touch panel may be used in a liquid crystal display, and the touch panel may be arranged on the top of a liquid crystal display panel that displays an image to detect position information of a user's input. However, when the touch panel is provided as a separate panel from the liquid crystal display panel, optical characteristics, such as brightness and viewing angle, may deteriorate and the thickness of the liquid crystal display panel may increase by the thickness of the touch panel.

SUMMARY OF THE INVENTION

Exemplary embodiments of the present invention provide a light sensor that may prevent short circuits and a production of leakage current in a display.

Exemplary embodiments of the present invention also provide a display apparatus having the light sensor built in a display panel.

Exemplary embodiments of the present invention additionally provide preventing shorting of a circuit between the gate electrode and the source and drain electrodes to alleviate leakage current.

Additional features of the invention will be set forth in the description which follows, and in part will be apparent from the description, or may be learned by practice of the invention.

An exemplary embodiment of the present invention discloses a light sensor arranged on a substrate to sense light. The light sensor comprises a light sensing layer arranged on the substrate to respond to the light, a source electrode arranged on the light sensing layer, a drain electrode arranged on the light sensing layer and spaced apart from the source electrode, an insulating layer covering the source electrode and the drain electrode, and a gate electrode arranged on the insulating layer to face the light sensing layer. An edge of the gate electrode is disposed on the light sensing layer at least in an area where the light sensing layer is overlapped with the source electrode and the drain electrode.

An exemplary embodiment of the present invention also discloses a display apparatus that comprises a display panel comprising a first substrate and a second substrate facing the first substrate to display an image and a plurality of light sensors arranged in the display panel to sense light. Each of the light sensors comprises a light sensing layer disposed on the first substrate or the second substrate to respond to the light, a source electrode disposed on the light sensing layer, a drain electrode disposed on the light sensing layer and spaced apart from the source electrode, an insulating layer covering the source electrode and the drain electrode, and a gate electrode disposed on the insulating layer to face the light sensing layer. An edge of the gate electrode is disposed on the light sensing layer at least in an area where the light sensing layer is overlapped with the source electrode and the drain electrode.

An exemplary embodiment of the present invention additionally discloses a display apparatus that comprises a display panel to display an image. The display panel comprises a first substrate on which a plurality of pixels is arranged, and a second substrate comprising. The second substrate comprises a first sensor to sense a first light comprising an infrared wavelength and a second sensor to sense a second light comprising a visible wavelength and a backlight unit arranged adjacent to the display panel to provide a white light to the first substrate. Each of the first sensors comprises a light sensing layer disposed on the second substrate to respond to the first light or the second light, a source electrode disposed on the light sensing layer, a drain electrode disposed on the light sensing layer and spaced apart from the source electrode, an insulating layer covering the source electrode and the drain electrode, and a gate electrode disposed on the insulating layer to face the light sensing layer. An edge of the gate electrode is arranged on the light sensing layer at least in an area where the light sensing layer is overlapped with the source electrode and the drain electrode.

An exemplary embodiment of the present invention further discloses a light sensor arranged on a substrate to sense light. The light sensor comprises a light sensing layer arranged on the substrate to respond to the light, a source electrode arranged on the light sensing layer, a drain electrode arranged on the light sensing layer and spaced apart from the source electrode, an insulating layer covering the source electrode and the drain electrode; a gate electrode arranged on the insulating layer to face the light sensing layer, and a light filter disposed between the substrate and the light sensing layer to block one of infrared wavelengths or visible wavelengths from impinging on the light sensing layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
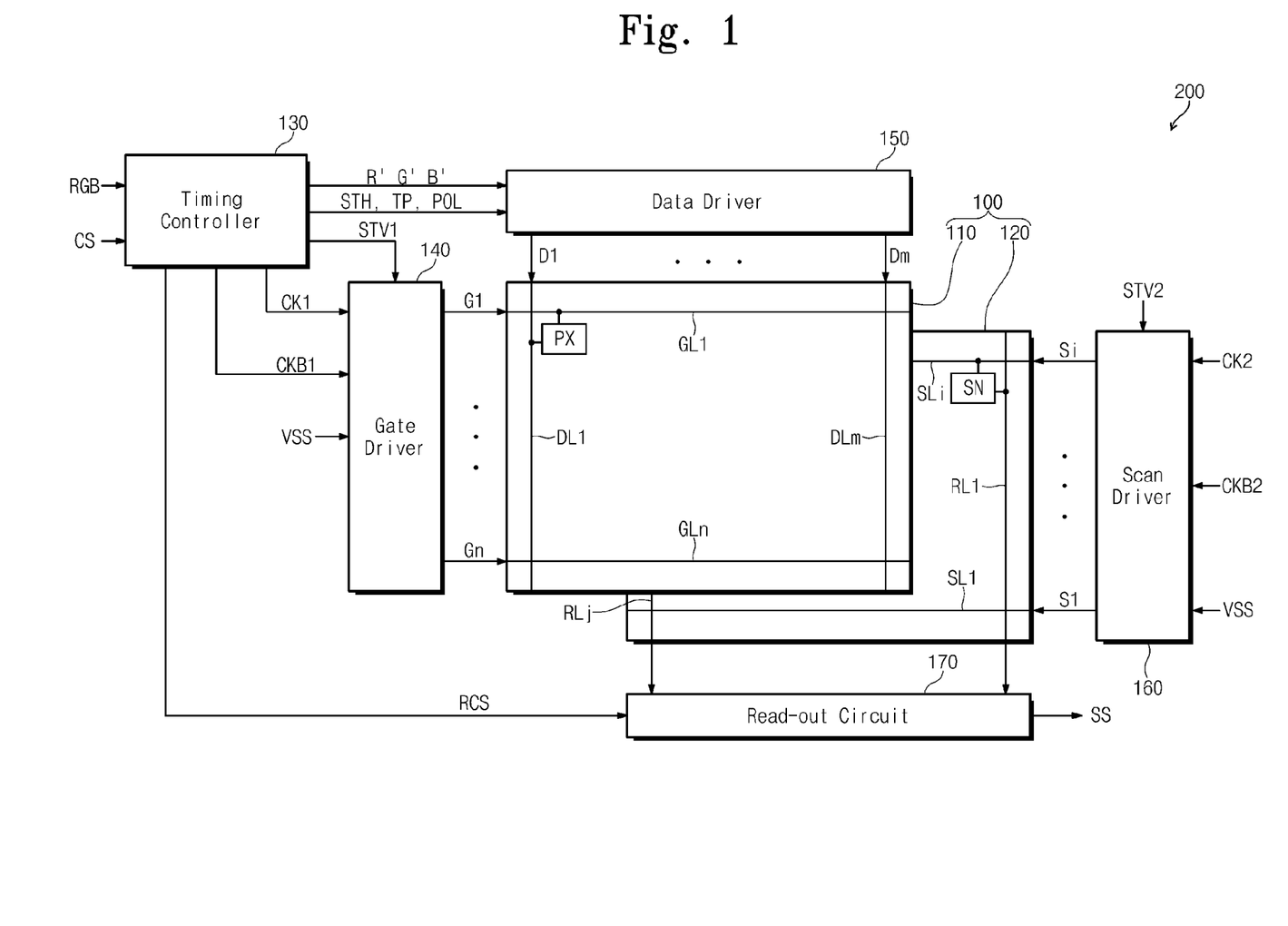
FIG. 1 is a block diagram of a display apparatus according to an exemplary embodiment of the present invention.
Figure 2:
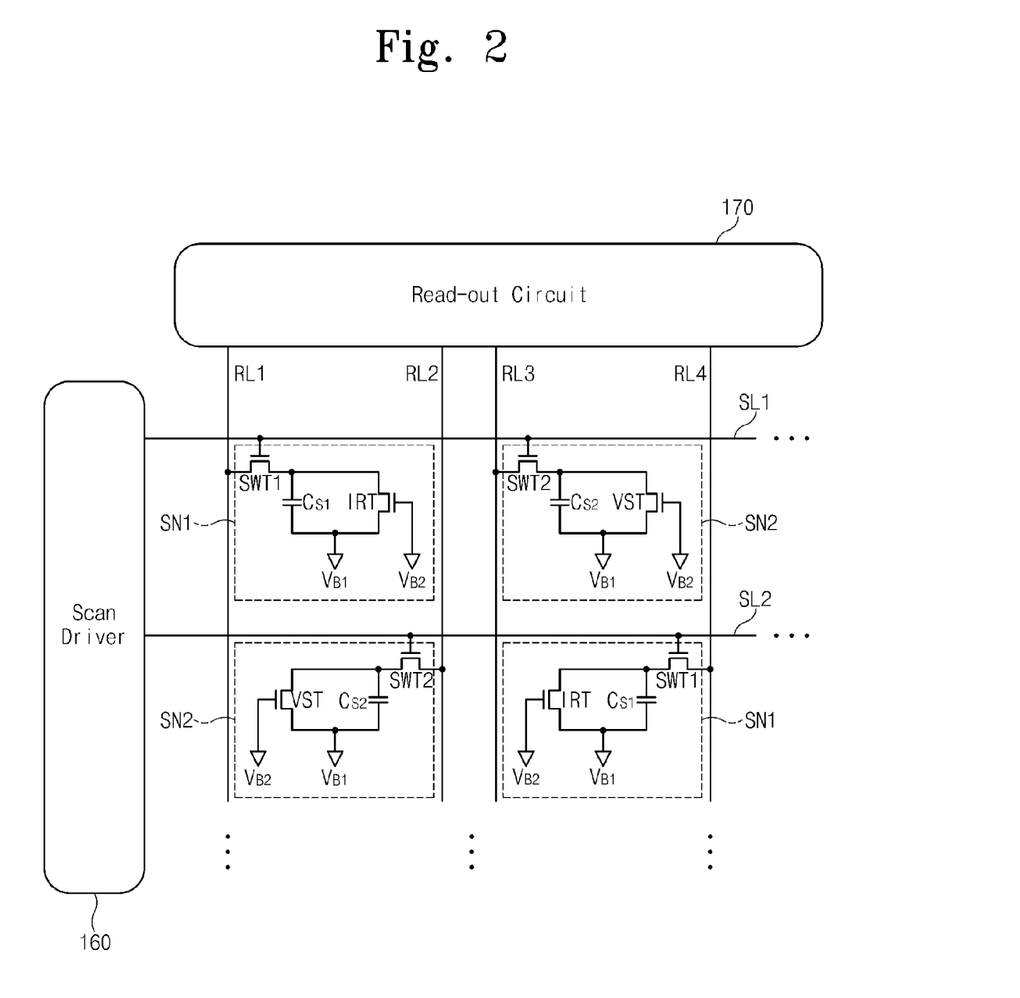
FIG. 2 is a circuit diagram showing a plurality of sensors of the display apparatus shown in FIG. 1.

FIG. 1 is a block diagram of a display apparatus according to an exemplary embodiment of the present invention, and FIG. 2 is a circuit diagram showing a plurality of sensors of the display apparatus shown in FIG. 1.

Referring to FIG. 1, a display apparatus 200 includes a display panel 100, a timing controller 130, a gate driver 140, a data driver 150, a scan driver 160, and a read-out circuit 170.

The timing controller 130 receives a plurality of image signals RGB and a plurality of control signals CS from an external source of the display apparatus 200. The timing controller 130 converts a data format of the image signals RGB so that they are appropriate to an interface between the timing controller 130 and the data driver 150 and provides the converted image signals R'G'B' to the data driver 150. Also, the timing controller 130 provides data control signal, such as an output start signal TP, a horizontal start signal STH, and a polarity inversion signal POL, to the data driver 150 and provides a gate control signal, such as a first start signal STV1, a first clock signal CK1, and a second clock signal CKB1, to the gate driver 140.

The gate driver 140 sequentially outputs gate signals G1 to Gn in response to the gate control signal STV1, CK1, and CKB1 provided from the timing controller 130.

The data driver 150 converts the image signals R'G'B' to data voltages D1 to Dm in response to the data control signal TP, STH, and POL provided from the timing controller 130 to output the data voltages D1 to Dm. The data voltages D1 to Dm are applied to the display panel 100.

The display panel 100 includes a first substrate 110, a second substrate 120 facing the first substrate 110, and a liquid crystal layer (not shown) interposed between the first substrate 110 and the second substrate 120. The first substrate 110 may include a plurality of pixels PX, and the second substrate 120 may include a plurality of sensors SN.

Hereinafter, the pixels PX may have the same circuit configuration so one pixel will be described as a representative example.

The first substrate 110 includes a plurality of gate lines GL1 to GLn, a plurality of data lines DL1 to DLm crossing the gate lines GL1 to GLn, and a plurality of pixels PX arranged thereon. Each pixel PX includes a thin film transistor (not shown) and a pixel electrode (not shown). The thin film transistor includes a gate electrode connected to a corresponding gate line among the gate lines GL1 to GLn, a source electrode connected to a corresponding data line among the data lines DL1 to DLm, and a drain electrode connected to the corresponding pixel electrode.

The gate lines GL1 to GLn are connected to the gate driver 140, and the data lines DL1 to DLm are connected to the data driver 150. The gate lines GL1 to GLn receive the gate signals G1 to Gn provided from the gate driver 140, and the data lines DL1 to DLm receive the data voltages D1 to Dm provided from the data drier 150.

Thus, the thin film transistor of each pixel PX is turned on in response to the gate signal applied through the corresponding gate line, and the data voltage applied to the corresponding data line is provided to the pixel electrode through the turned-on thin film transistor.

Meanwhile, the second substrate 120 may include a reference electrode (not shown) facing the pixel electrode with the liquid crystal layer therebetween.

In addition, the second substrate 120 includes a plurality of scan lines SL1 to SLi, a plurality of read-out lines RL1 to RLj crossing the scan lines SL1 to SLi, and the sensors SN.

In FIG. 2, for the convenience of explanation, a first scan line SL1 and a second scan line SL2 among the scan lines SL1 to SLi and first to fourth read-out lines RL1 to RL4 among the read-out lines RL1 to RLj are shown.

Referring to FIG. 2, the sensors SN may be divided into at least two types of sensors. For instance, the sensors SN may include a plurality of first sensors SN1 to sense a first light having an infrared wavelength and a plurality of second sensors SN2 to sense a second light having a visible wavelength.

Each of the first sensors SN1 includes a first switching transistor SWT1, a first sensor transistor IRT, and a first capacitor $C_{S1}$. The first switching transistor SWT1 includes a gate electrode connected to a corresponding scan line among the scan lines SL1 to SLi, a source electrode connected to a corresponding read-out line among the read-out lines RL1 to RLj, and a drain electrode connected to the first capacitor $C_{S1}$ and the first sensor transistor IRT.

The first capacitor $C_{S1}$ includes a first electrode connected to the drain electrode of the first switching transistor SWT1 and a second electrode receiving a first bias voltage $V_{B1}$. As an example, the first bias voltage $V_{B1}$ may be about −8.75 volts.

The first sensor transistor IRT includes a gate electrode receiving a second bias voltage $V_{B2}$, a source electrode connected to the drain electrode of the first switching transistor SWT1, and a drain electrode receiving the first bias voltage $V_{B1}$. The second bias voltage $V_{B2}$ may have a lower voltage level than a voltage level of the first bias voltage $V_{B1}$. As an example, the second bias voltage $V_{B2}$ may be about −13.75 volts.

The first sensor transistor IRT generates a photo current corresponding to the amount of a first light incident on first sensor transistor IRT, e.g., from an external light source. The first light may have an infrared wavelength. A structure providing the first light to the first sensor transistor IRT is described with reference to FIG. 9 below.

A voltage charged in the first capacitor $C_{S1}$ increases by the amount of photo current generated from the first sensor transistor IRT. That is, as the amount of the first light incident to the first sensor transistor IRT increases, the voltage charged in the first capacitor $C_{S1}$ increases. Thus, the first sensor transistor IRT may sense the first light.

Meanwhile, each of the second sensors SN2 includes a second switching transistor SWT2, a second sensor transistor VST, and a second capacitor $C_{S2}$. The second switching transistor SWT2 includes a gate electrode connected to a corresponding scan line among the scan lines SL1 to SLi, a source electrode connected to a corresponding read-out line among the read-out lines RL1 to RLj, and a drain electrode connected to the second capacitor $C_{S2}$ and the second sensor transistor VST.

The second capacitor $C_{S2}$ includes a first electrode connected to the drain electrode of the second switching transistor SWT2 and a second electrode receiving the first bias voltage $V_{B1}$.

The second sensor transistor VST includes a gate electrode receiving the second bias voltage $V_{B2}$, a source electrode connected to the drain electrode of the second switching transistor SWT2, and a drain electrode receiving the first bias voltage $V_{B1}$.

The second sensor transistor VST generates a photo current corresponding to the amount of a second light incident on the second sensor transistor VST, e.g., from an external source. The second light may have a visible wavelength. A voltage charged in the second capacitor $C_{S2}$ may increase by the amount of photo current generated by the second sensor transistor VST. Thus, the second sensor transistor VST may sense the second light.

Meanwhile, the scan lines SL1 to SLi are connected to the scan driver 160 to receive sequentially a plurality of scan signals S1 to Si, respectively. The scan driver 160 receives a scan control signal, such as a second start signal STV2, a third clock signal CK2, and a fourth clock signal CKB2, from the timing controller 130 to output sequentially the scan signals S1 to Si. The scan control signal STV2, CK2, and CKB2 may be signals that are synchronized with the gate control signal STV1, CK1, and CKB1.

The read-out lines RL1 to RLj are connected to the read-out circuit 170 to provide a voltage charged in the corresponding sensors SN1 and SN2 to the read-out circuit 170.

As shown in FIG. 2, the first and second sensors SN1 and SN2 are alternately arranged in a first direction corresponding to the length direction that the scan lines SL1 to SLi extend. Also the first and second sensors SN1 and SN2 are alternately arranged in a second direction corresponding to the length direction that the read-out lines RL1 to RLj extend.

In the present exemplary embodiment, the first sensors SN1 may be connected to a (4k−3)-th read-out line (e.g., a first read-out line RL1 in FIG. 2) and a 4k-th read-out line (e.g., a fourth read-out line RL4 in FIG. 2) among the read-out lines RL1 to RLj. The "k" is a natural number equal to or larger than 1. In addition, the second sensors SN2 are connected to a (4k−2)-th read-out line (e.g., a second read-out line RL2 in FIG. 2) and a (4k−1)-th read-out line (e.g., a third read-out line RL3 in FIG. 2).

When the first and second switching transistors SWT1 and SWT2 are turned on in response to the scan signal provided to the corresponding scan line, the first and second sensors SN1 and SN2 provide the voltage charged in the first and second capacitors $C_{S1}$ and $C_{S2}$ to the corresponding read-out line through the turned-on switching transistors SWT1 and SWT2, respectively.

The read-out circuit 170 sequentially provides the voltages SS received from the read-out lines RL1 to RLj to the timing controller 130 in response to control signals RCS applied from the timing controller 130. The timing controller 130 may generate two-dimensional coordinates of a touched point or an object to be scanned on a screen based on the generation timing of the scan signal and the voltages SS received from the read-out circuit 170.

Figure 3:
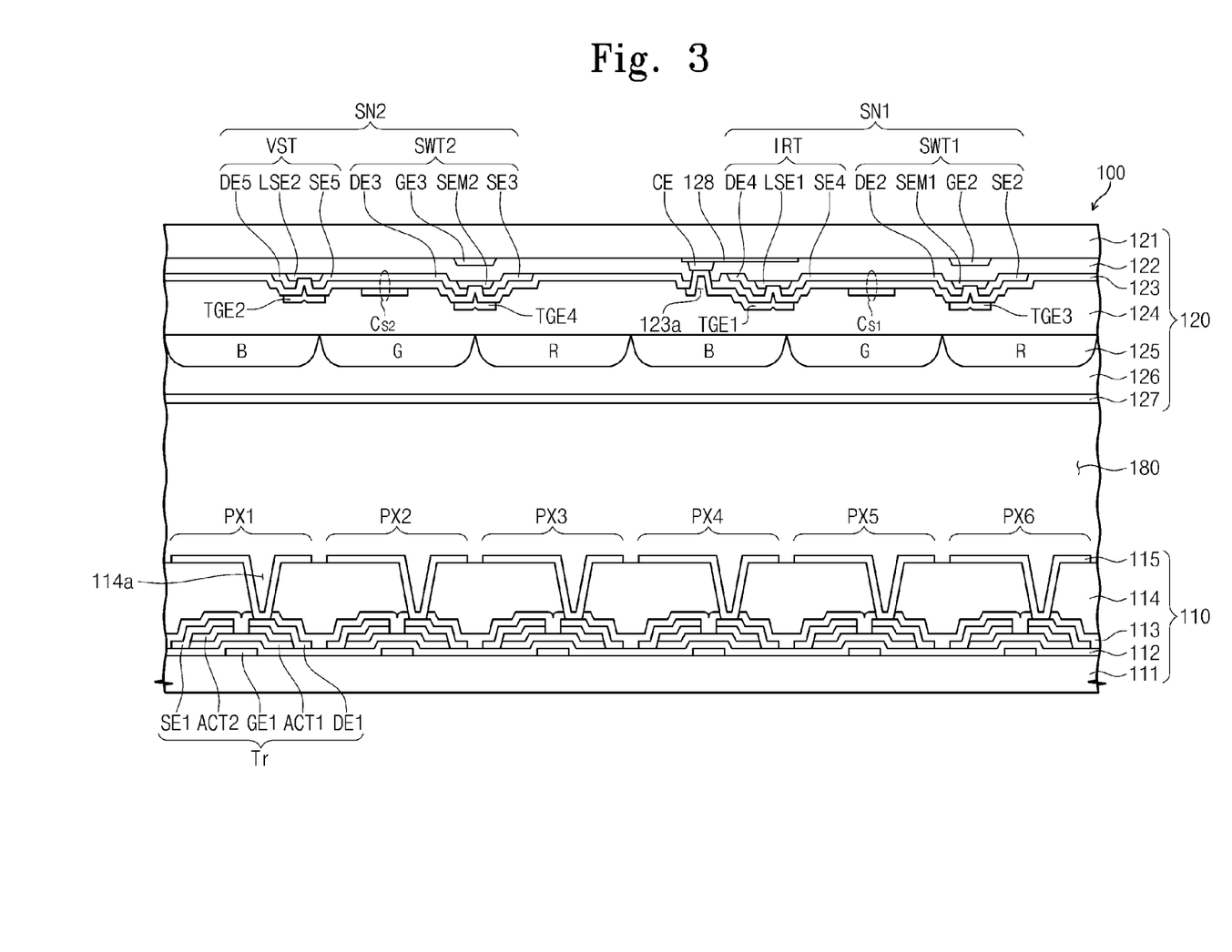
FIG. 3 is a cross-sectional view showing a display panel according to an exemplary embodiment of the present invention.

FIG. 3 is a cross-sectional view of a display panel according to an exemplary embodiment of the present invention.

Referring to FIG. 3, a display panel 100 includes a first substrate 110, a second substrate 120 facing the first substrate 110, and a liquid crystal layer 180 interposed between the first substrate 110 and the second substrate 120.

The first substrate 110 includes a first base substrate 111 and a plurality of pixels PX arranged on the first base substrate 111. Each of the pixels PX includes a thin film transistor Tr and a pixel electrode 115.

FIG. 3 shows six pixels PX1, PX2, PX3, PX4, PX5, and PX6 arranged in a first direction. The six pixels PX1, PX2, PX3, PX4, PX5, and PX6 have the same configuration. Thus, one pixel is described as a representative example, and similar descriptions for the other pixels may not be repeated.

A gate electrode GE1 of the thin film transistor Tr is formed on the first base substrate 111. The gate electrode GE1 is covered by a first gate insulating layer 112.

An active layer ACT1 and an ohmic contact layer ACT2 are formed on the first gate insulating layer 112 to face the gate electrode GE1. Then, a source electrode SE1 and a drain electrode DE1 spaced apart from the source electrode SE1 with a predetermined distance are formed on the ohmic contact layer ACT2. The source electrode SE1 and the drain electrode DE1 are covered by a first protective layer 113, and an organic insulating layer 114 is further formed on the first protective layer 113.

The first protective layer 113 and the organic insulating layer 114 are provided with a contact hole 114a formed through them (113, 114) to expose the drain electrode DE1. The pixel electrode 115 is formed on the organic insulating layer 114 and electrically connected to the drain electrode DE1 through the contact hole 114a.

Meanwhile, the second substrate 120 includes a second base substrate 121, a plurality of sensors SN formed on the second base substrate 121, a color filter layer 125 including a plurality of color pixels R, G, and B respectively corresponding to the pixels, and a reference electrode 127.

The sensors SN are formed on the second base substrate 121. The sensors SN include a first sensor SN1 and a second sensor SN2. The first sensor SN1 includes a first switching transistor SWT1 (shown in FIG. 2), a first capacitor $C_{S1}$, and a first sensor transistor IRT (FIG. 2). As in FIG. 2, the second sensor SN2 includes a second switching transistor SWT2, a second capacitor $C_{S2}$, and a second sensor transistor VST.

Since the first sensor SN1 and the second sensor SN2 have a similar structure, the first and second sensors SN1 and SN2 may be formed by a same or similar process substantially simultaneously.

Particularly, a gate electrode GE2 of the first switching transistor SWT1 and a gate electrode GE3 of the second switching transistor SWT2 are formed on the second base substrate 121.

A second gate insulating layer 122 is formed on the second base substrate 121 to cover the gate electrodes GE2 and GE3 of the first and second switching transistors SWT1 and SWT2. A semiconductor layer SEM1 of the first switching transistor SWT1 and a semiconductor layer SEM2 of the second switching transistor SWT2 are formed on the second gate insulating layer 122. The semiconductor layers SEM1 and SEM2 may include an amorphous silicon layer.

Also, a first light sensing layer LSE1 of the first sensor transistor IRT and a second light sensing layer LSE2 of the second sensor transistor VST are formed on the second gate insulating layer 122. The first light sensing layer LSE1 may include silicon germanium (SiGe) to sense a first light having an infrared wavelength, and the second light sensing layer LSE2 may include amorphous silicon (a-Si) to sense a second light having a visible wavelength.

The second substrate 120 may further include an infrared filter 128 to block the second light and transmit the first light. The infrared filter 128 may be arranged between the second base substrate 121 and the second gate insulating layer 122 corresponding to the first light sensing layer LSE1. In the present exemplary embodiment, the infrared filter 128 may include silicon germanium (SiGe).

A source electrode SE2 and a drain electrode DE2 spaced apart from the source electrode SE2 with a predetermined distance are formed on the semiconductor layer SEM1 of the first switching transistor SWT1, and a source electrode SE3 and a drain electrode DE3 spaced apart from the source electrode SE3 with a predetermined distance are formed on the semiconductor layer SEM2 of the second switching transistor SWT2. Thus, the first and second switching transistors SWT1 and SWT2 are completed.

Meanwhile, a source electrode SE4 and a drain electrode DE4 spaced apart from the source electrode SE4 with a predetermined distance are formed on the first light sensing layer LSE1 of the first sensor transistor IRT, and a source electrode SE5 and a drain electrode DE5 spaced apart from the source electrode SE5 with a predetermined distance are formed on the second light sensing layer LSE2 of the second sensor transistor VST.

The source electrode SE4 of the first sensor transistor IRT is electrically connected to the drain electrode DE2 of the first switching transistor SWT1, and the source electrode SE4 may serve as a first electrode of the first capacitor $C_{S1}$.

Also, the source electrode SE5 of the second sensor transistor VST is electrically connected to the drain electrode DE3 of the second switching transistor SWT2, and the source electrode SE5 may serve as a first electrode as the second capacitor $C_{S2}$.

The source and drain electrodes SE2 and DE2 of the first switching transistor SWT1, the source and drain electrodes SE3 and DE3 of the second switching transistor SWT2, the source and drain electrodes SE4 and DE4 of the first sensor transistor IRT, and the source and drain electrodes SE5 and DE5 of the second sensor transistor VST are covered by a second protective layer 123.

A gate electrode TGE1 (hereinafter, referred to as a first top gate) of the first sensor transistor IRT and a gate electrode TGE2 (hereinafter, referred to as a second top gate) of the second sensor transistor VST are formed on the second protective layer 123.

In addition, a second electrode of the first capacitor CS1 and a second electrode of the second capacitor CS2 are formed on the second protective layer 123.

In the present exemplary embodiment, the first switching transistor SWT1 may further include a dummy gate electrode TGE3 disposed on the second protective layer 123 and electrically connected to the gate electrode GE2. In addition, the second switching transistor SWT2 may further include a dummy gate electrode TGE4 disposed on the second protective layer 123 and electrically connected to the gate electrode GE3.

As shown in FIG. 3, the first top gate TGE1 of the first sensor transistor IRT may be electrically connected to the infrared filter 128 by a connection electrode CE that may be disposed on the infrared filter 128 by the same or similar process as the gate electrode GE2 of the first switching transistor SWT1. The second gate insulating layer 122 and the second protective layer 123 are provided with a second contact hole 123a formed therethrough to expose the connection electrode CE, and the first top gate TGE1 may be electrically connected to the connection electrode CE through the second contact hole 123a.

The first and second top gates TGE1 and TGE2 of the first and second sensor transistors IRT and VST and the dummy gate electrodes TGE3 and TGE4 of the first and second switching transistors SWT1 and SWT2 may be covered by a second organic insulating layer 124. The color filter layer 125 is formed on the second organic insulating layer 124. The color filter layer 125 may include a red color filter R, a green color filter G, and a blue color filter B, and each of the red, green, and blue color filters R, G, and B may be arranged corresponding to a pixel.

An over-coating layer 126 is formed on the color filter layer 125. The reference electrode 127 is formed on the over-coating layer 126.

Figure 4:
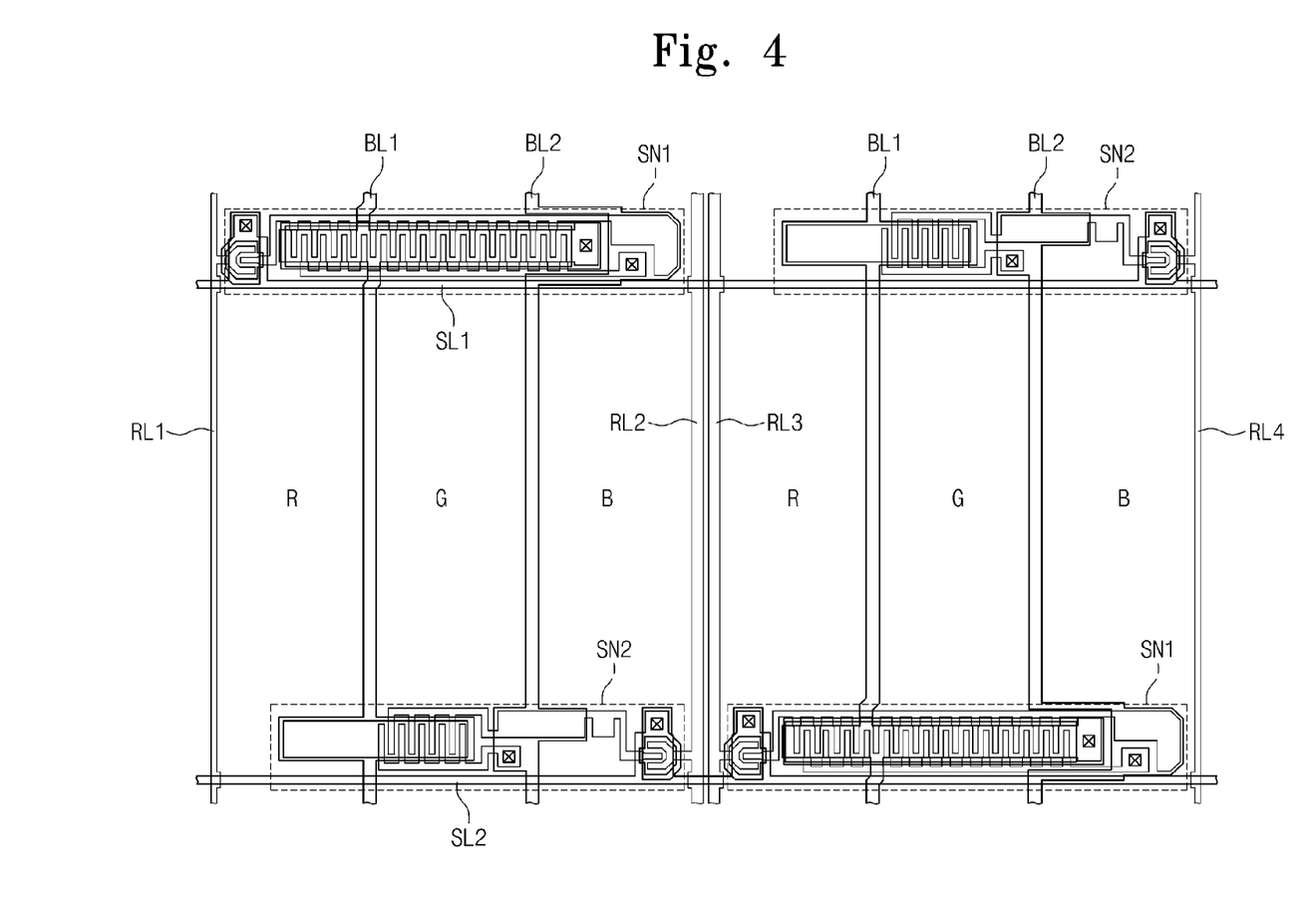
FIG. 4 is a plan view showing a layout of a second substrate according to an exemplary embodiment of the present invention.

FIG. 4 is a plan view showing a layout of a second substrate according to an exemplary embodiment of the present invention.

Referring to FIG. 4, a second substrate 120 includes a first scan line SL1 and a second scan line SL2 extending in a first direction, a first read-out line RL1, a second read-out line RL2, a third read-out line RL3, and a fourth read-out line RL4 extending in a second direction substantially perpendicular to the first direction, and a first bias line BL1 and a second bias line BL2 extending in the second direction.

First sensors SN1 and second sensors SN2 are alternately arranged in the first direction and in the second direction. In the present exemplary embodiment, the first read-out line RL1 is connected to the first sensors SN1 and the second read-out line RL2 is connected to the second sensors SN2. The third read-out line RL3 is connected to the first sensors SN1 and the fourth read-out line RL4 is connected to the second sensors SN2.

The first bias line BL1 receives a first bias voltage $V_{B1}$ from an external source to provide the first bias voltage $V_{B1}$ to the first and second sensors SN1 and SN2. The second bias line BL2 receives a second bias voltage $V_{B2}$ having a magnitude less than that of the first bias is voltage $V_{B1}$ regardless of polarity to provide the second bias voltage $V_{B2}$ to the first and second sensors SN1 and SN2.

When viewed in a plan view, the first and second bias lines BL1 and BL2 are arranged between the first read-out line RL1 and the second read-out line RL2 and between the third read-out line RL3 and the fourth read-out line RL4.

The second substrate 120 further includes a red color pixel R, a green color pixel G, and a blue color pixel B. The red color pixel R, the green color pixel G, and the blue color pixel B are arranged in the first direction in an order of the red, green, and blue color pixels R, G, and B. Additionally, the order of the red, green, and blue color pixels R, G, and B may occur in various orders.

Figure 5:
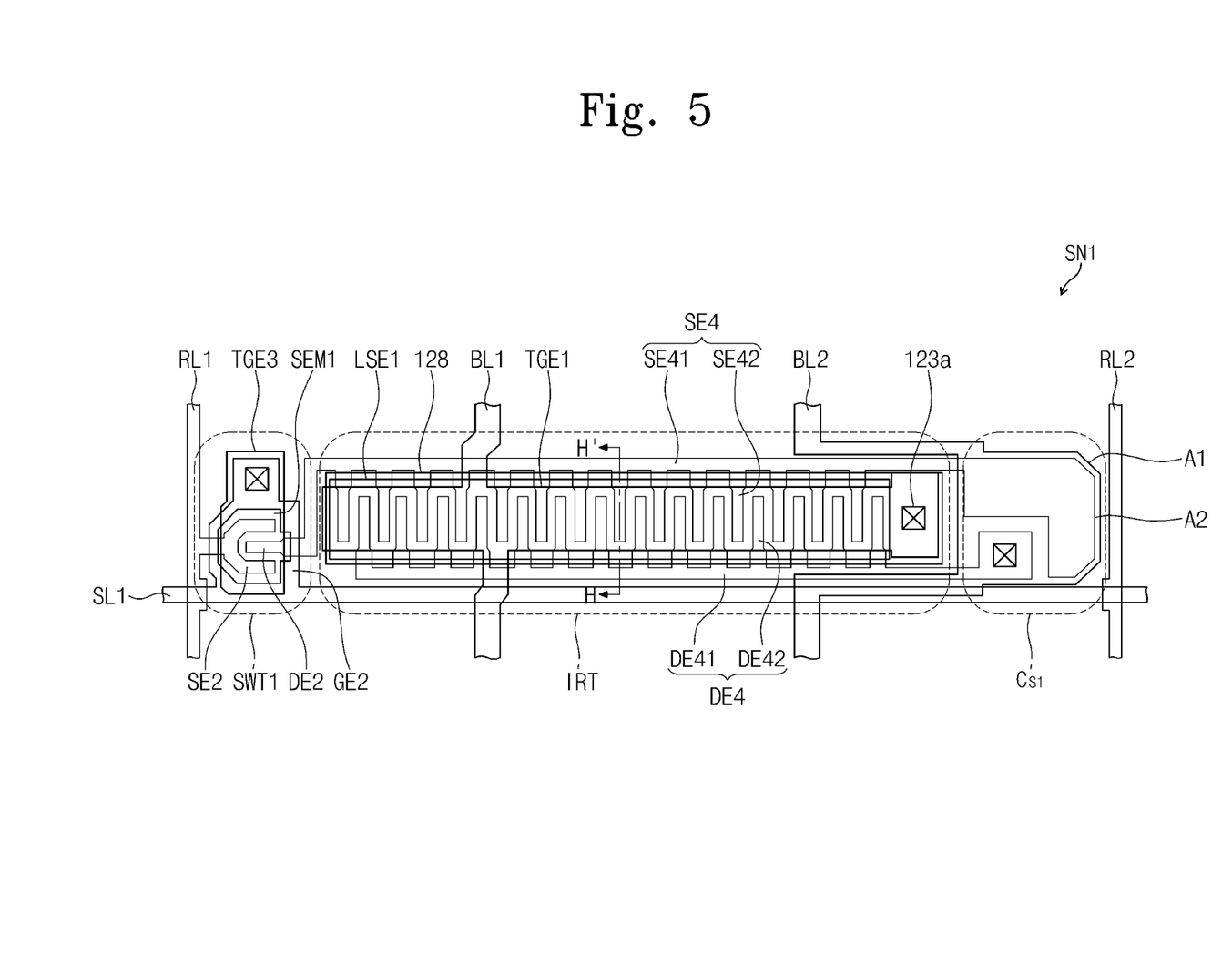
FIG. 5 is an enlarged view showing a first sensor of FIG. 4.
Figure 6:
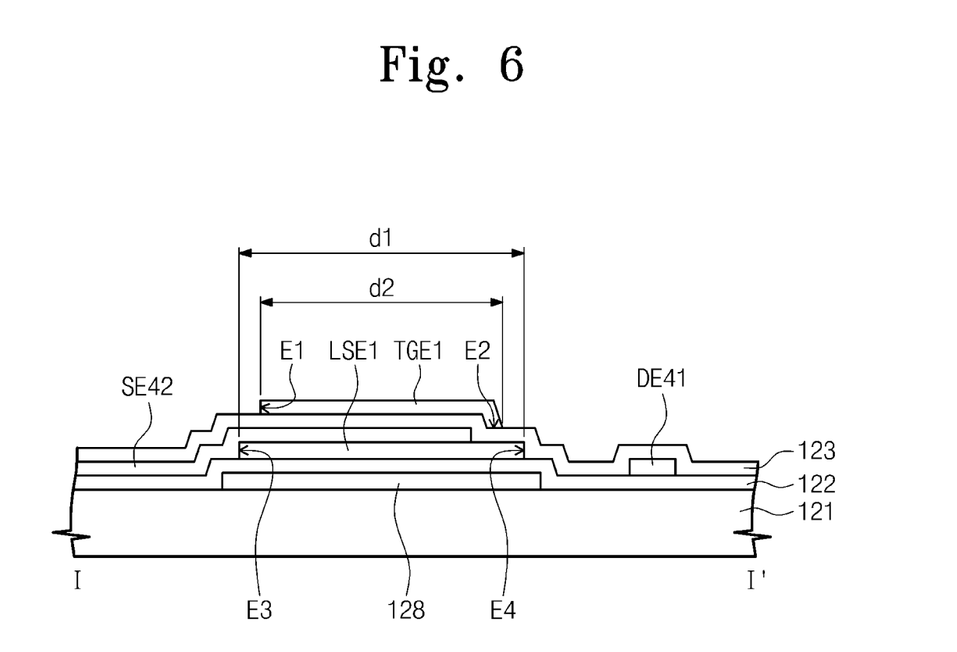
FIG. 6 is a cross-sectional view taken along line I-I' of FIG. 5.

FIG. 5 is an enlarged view showing the first sensor of FIG. 4, and FIG. 6 is a cross-sectional view taken along line I-I' of FIG. 5.

Referring to FIG. 5, each of the first sensors SN1 includes a first switching transistor SWT1, a first capacitor $C_{S1}$, and a first sensor transistor IRT.

The first switching transistor SWT1 includes a gate electrode GE2 branched from the first scan line SL1, a semiconductor layer SEM1 disposed on the gate electrode GE2, a source electrode SE2 branched from the first read-out line RL1, and a drain electrode DE2 spaced apart from the source electrode SE2 on the semiconductor layer SEM1. Thus, the first switching transistor SWT1 is turned on in response to a scan signal applied from the first scan line SL1 to output a predetermined signal to the first read-out line RL1.

In the present exemplary embodiment, the first switching transistor SWT1 may further include a first dummy gate electrode TGE3 disposed on the source and drain electrodes SE2 and DE2 and electrically connected to the gate electrode GE2 via a contact hole through the source and drain electrodes SE2 and DE2. Thus, a driving capability of the first switching transistor SWT1 may be improved by forming the first dummy gate electrode TGE3.

The first sensor transistor IRT includes a first light sensing layer LSE1 to sense a first light having an infrared wavelength, a source electrode SE4 extending from the drain electrode DE2 of the first switching transistor SWT1 and disposed on the first light sensing layer LSE1, a drain electrode DE4 spaced apart from the source electrode SE4 on the first light sensing layer LSE1, and a first top gate TGE1 branched from the first bias line BL1 and disposed on the source and drain electrodes SE4 and DE4. The first top gate TGE1 receives the first bias voltage $V_{B1}$ through the first bias line BL1. The drain electrode DE4 of the first sensor transistor IRT is electrically connected to the second bias line BL2 to receive the second bias voltage $V_{B2}$.

The source electrode SE4 of the first sensor transistor IRT includes a first body electrode SE41 extending in the first direction to which the first scan line SL1 extends and a plurality of first branch electrodes SE42 branched from the first body electrode SE41 and arranged in the second direction. The first branch electrodes SE42 are arranged on the first light sensing layer LSE1.

The drain electrode DE4 of the first sensor transistor IRT includes a second body electrode DE41 extending in the first direction and a plurality of second branch electrodes DE42 branched from the second body electrode DE41 and arranged in the second direction. The second branch electrodes DE42 are also arranged on the first light sensing layer LSE1.

The first branch electrodes SE42 may be alternately arranged with the second branch electrodes DE42 to form an interdigitating system with separation between the first and second branch electrodes SE42 and DE42. That is, one second branch electrode DE42 is disposed between two adjacent first branch electrodes SE42.

The first top gate TGE1 that serves as the gate electrode of the first sensor transistor IRT includes a first end E1 extending in the first direction to cross the first branch electrodes SE42 and a second end E2 arranged parallel to the first end E1 to cross the second branch electrodes DE42.

The first light sensing layer LSE1 includes a third end E3 and a fourth end E4, which are arranged substantially in parallel to the first and second ends E1 and E2, respectively. The third end E3 of the first light sensing layer LSE1 crosses the first branch electrodes SE42, and the fourth end E4 crosses the second branch electrodes DE42.

In addition, the first and second ends E1 and E2 of the first top gate TGE1 are disposed on the first light sensing layer LSE1 at least in an area where the first light sensing layer LSE1 is overlapped with the first and second branch electrodes SE42 and DE42, respectively.

As shown in FIG. 6, a distance d2 between the first end E1 and the second end E2 is shorter than a distance d1 between the third end E3 and the fourth end E4. That is, the first end E1 and the second end E2 are located within the third end E3 and the fourth end E4. More specifically, the first end E1 of the first top gate TGE1 and the third end E3 of the first light sensing layer LSE1 may be spaced apart at least 1 μm, and the second end E2 of the first top gate TGE1 and the fourth end E4 of the first light sensing layer LSE1 may be spaced apart at least 1 μm. Therefore, the first and second ends E1 and E2 of the first top gate TGE1 may be disposed on the first light sensing layer LSE1.

Referring again to FIG. 5, the first capacitor $C_{S1}$ includes a first electrode A1 extending from the second bias line BL2 and a second electrode A2 extending from the source electrode SE4 of the first sensor transistor IRT so that the first electrode A1 faces the second electrode A2.

The first sensor SN1 further includes an infrared filter 128 disposed under the first light sensing layer LSE1 of the first sensor transistor IRT to filter light propagating toward the first light sensing layer LSE1. The infrared filter 128 blocks the second light having a visible wavelength and transmits the first light having an infrared wavelength to provide only the first light to the first light sensing layer LSE1.

In the present exemplary embodiment, the infrared filter 128 may include a semiconductor material such as silicon germanium (SiGe). The infrared filter 128 may be electrically connected to the first top gate TGE1 so that the infrared filter 128 may be used as the gate electrode of the first sensor transistor IRT, thereby improving the driving capability of the first sensor transistor IRT.

Figure 7:
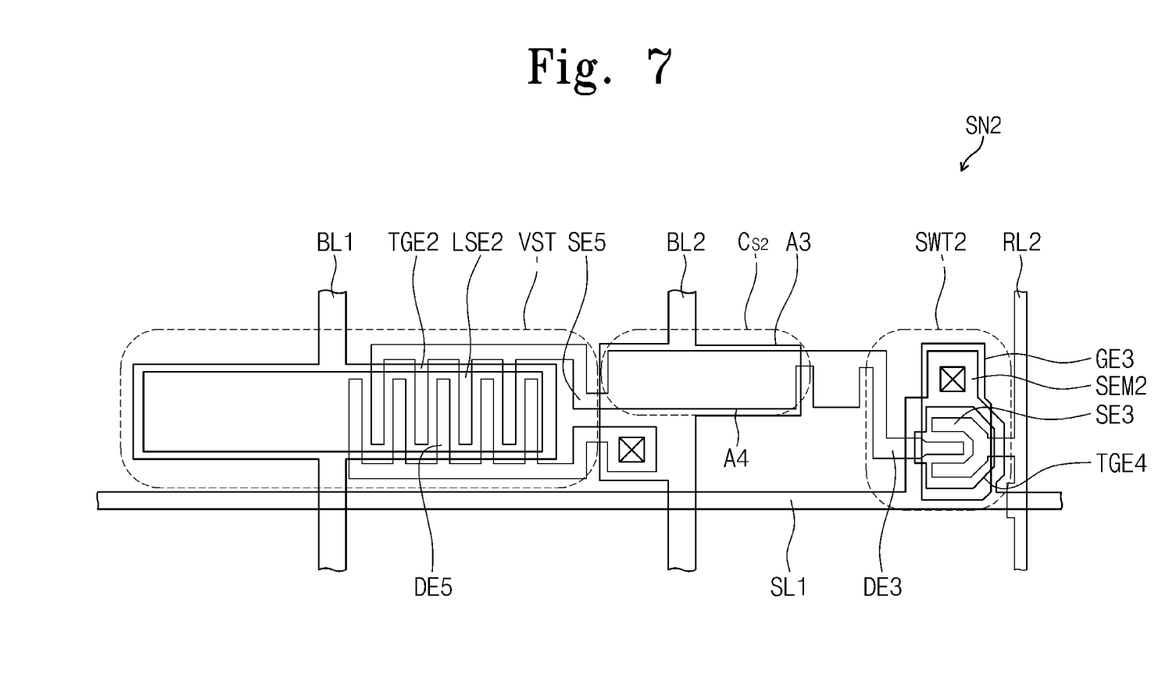
FIG. 7 is an enlarged view showing a second sensor of FIG. 4.

FIG. 7 is an enlarged view showing the second sensor of FIG. 4.

Referring to FIG. 7, the second sensor SN2 includes a second switching transistor SWT2, a second capacitor $C_{S2}$, and a second sensor transistor VST.

The second switching transistor SWT2 includes a gate electrode GE3 branched from the first scan line SL1, a semiconductor layer SEM2 disposed on the gate electrode GE3, a source electrode SE3 branched from the second read-out line RL2, and a drain electrode DE3 spaced apart from the source electrode SE3 on the semiconductor layer SEM2. Thus, the second switching transistor SWT2 is turned on in response to a scan signal applied from the first scan line SL1 to output a predetermined signal to the second read-out line RL2.

In the present exemplary embodiment, the second switching transistor SWT2 may further include a second dummy gate electrode TGE4 disposed on the source and drain electrodes SE3 and DE3 and may be electrically connected to the gate electrode GE3. The driving capability of the second switching transistor SWT4 may be improved by forming the second dummy gate electrode TGE4.

The second capacitor $C_{S2}$ includes a first electrode A3 branched from the second bias line BL2 to receive the second bias voltage $V_{B2}$ and a second electrode A4 branched from the drain electrode DE3 of the second switching transistor SWT2 to face the first electrode A3.

The second sensor transistor VST includes a second light sensing layer LSE2 to sense the second light having a visible wavelength, a source electrode SE5 extending from the second electrode A4 of the second capacitor $C_{S2}$ and disposed on the second light sensing layer LSE2, a drain electrode DE5 spaced apart from the source electrode SE5 on the second light sensing layer LSE2, and a second top gate TGE2 branched from the first bias line BL1 and disposed on the source and drain electrodes SE5 and DE5. The second top gate TGE2 receives the first bias voltage $V_{B1}$ through the first bias line BL1. The drain electrode DE5 of the second sensor transistor VST is electrically connected to the second bias line BL2 to receive the second bias voltage $V_{B2}$. Also, the drain electrode and DE5 and the source electrode SE5 may have interdigitated projections as shown in FIG. 7 to enhance sensitivity of the second sensor transistor VST.

The first and second sensors SN1 and SN2 disposed on the second substrate 120 are described above with reference to FIG. 5, FIG. 6, and FIG. 7. However, the structure of the first and second sensors SN1 and SN2 are not limited solely to the above descriptions.

Figure 8:
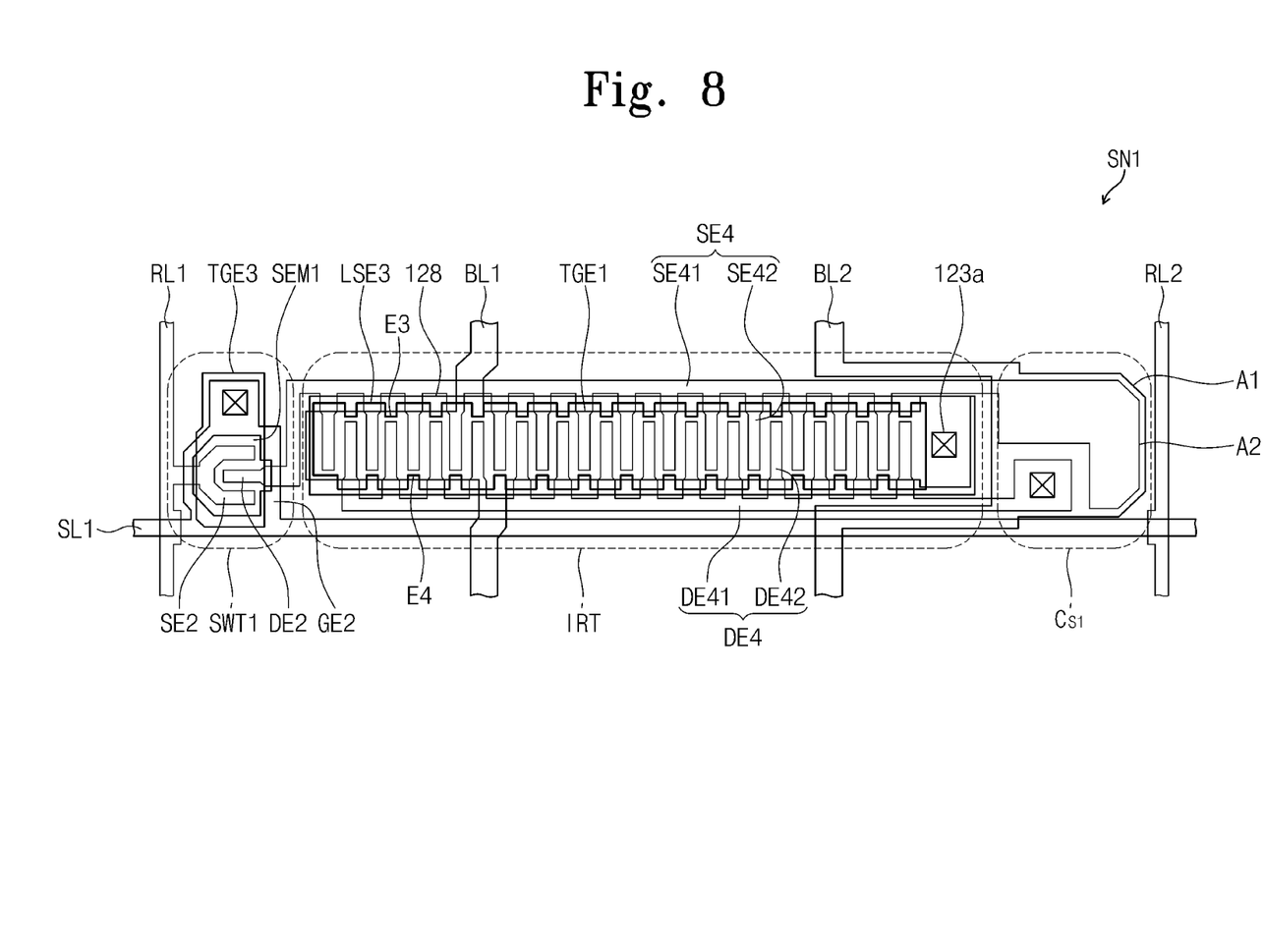
FIG. 8 is a plan view showing a first sensor according to another exemplary embodiment of the present invention.

FIG. 8 is a plan view showing a first sensor according to another exemplary embodiment of the present invention. In FIG. 8, the same reference numerals denote the same elements in FIG. 5, and thus detailed descriptions of the same elements may be omitted.

Referring to FIG. 8, a first sensor SN1 includes a first sensor transistor IRT having a third light sensing layer LSE3.

Particularly, the third light sensing layer LSE3 includes a third end E3 crossing first branch electrodes SE42 of the first sensor transistor IRT and a fourth end E4 crossing second branch electrodes DE42 of the first sensor transistor IRT.

The third end E3 of the third light sensing layer LSE3 has portions that are recessed toward the fourth end E4 in an area between two adjacent first branch electrodes SE42, i.e., the edge of the third end E3 has an undulating square-shaped pattern. In addition, the fourth end E4 of the third light sensing layer LSE3 is recessed toward the third end E3 in an area between two adjacent second branch electrodes DE42 and has an opposing undulating square-shaped pattern.

Thus, the first end E1 of the first top gate TGE1 is positioned within the border of the third end E3 in an area where the third light sensing layer LSE3 overlaps the first branch electrodes SE42. In addition, the second end E2 of the first top gate TGE1 is positioned within the border of the fourth end E4 in an area where the third light sensing layer LSE3 overlaps the second branch electrodes DE42. More specifically, the first end E1 of the first top gate TGE1 and the third end E3 of the first light sensing layer LSE1 may be spaced apart at least 1 μm, and the second end E2 of the first top gate TGE1 and the fourth end E4 of the first light sensing layer LSE1 may be spaced apart at least 1 μm. Thus, the first and second ends E1 and E2 of the first top gate TGE1 may be disposed on the third light sensing layer LSE3 at least in an area where the third light sensing layer LSE3 overlaps the first and second branch electrodes SE42 and DE42.

Figure 9:
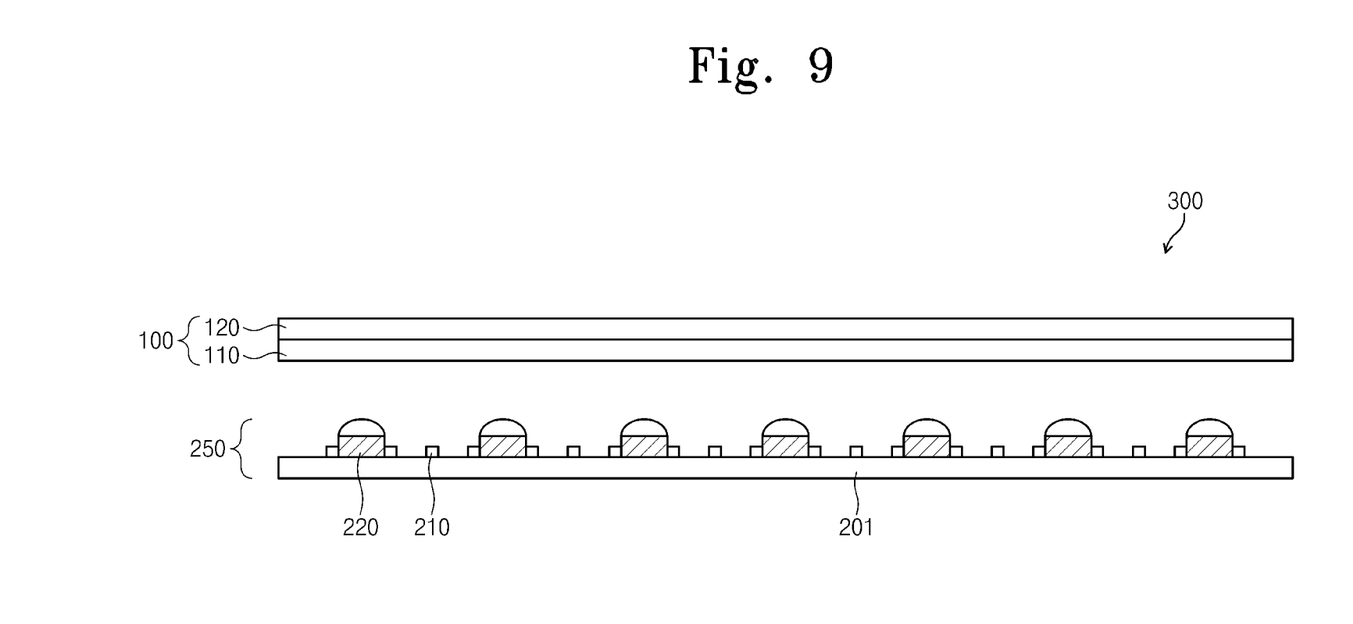
FIG. 9 is a cross-sectional view showing a display apparatus according to another exemplary embodiment of the present invention.

FIG. 9 is a cross-sectional view showing a display apparatus according to another exemplary embodiment of the present invention.

Referring to FIG. 9, a display apparatus 300 includes a display panel 100 to display an image and a backlight unit 250 disposed under the display panel 100.

Since the structure of the display panel 100 has been described in detail with reference to FIG. 1, detailed descriptions of the display panel 100 may not be repeated.

Meanwhile, the backlight unit 250 includes a circuit board 201 disposed under the display panel 100, a plurality of first light sources 210 mounted on the circuit board 201 to emit a first light having an infrared wavelength, and a plurality of second light sources 220 mounted on the circuit board 201 to emit a visible light, which may be a white light source.

The first light sources 210 may be alternately arranged with the second light sources 220. In the present exemplary embodiment, one or more second light sources 220 may be arranged between two first light sources 210 adjacent to each other as shown in FIG. 9. Each of the first and second light sources 210 and 220 may include light emitting diodes, and, alternatively, other frequency generating sources may be provided.

The light, e.g., white light, emitted from the second light sources 220 is incident to the display panel 100, and the light transmits through the liquid crystal layer 180 (shown in FIG. 3). The light transmission of the liquid crystal layer 180 may be controlled by an electric field between the pixel electrode 115 and the reference electrode 127. That is, the display panel 100 may control the transmission of the white light by the liquid crystal layer 180 to display an image having a desired gray scale.

The first light emitted from the first light sources 210 impinges on the display panel 100, and a portion of the first light may be transmitted by the display panel 100. Since the first light transmitted through the display panel 100 is not visible to a user's eye, it does not affect the perception of an image displayed on the display panel 100.

The first light emitted from the first light sources 210 is partially reflected by a plurality of layers in the display panel 100 and partially propagates through the display panel 100. The first light passing through the display panel 100 exits to the exterior. When an object, for example, a finger, is present on the display panel 100, the first light may be reflected by the object. Thus, the reflected first light is incident to the display panel 100 again, so that the first sensor transistor IRT (shown in FIG. 3) may sense the reflected first light.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A light sensor disposed on a substrate to sense light, the light sensor comprising:
   a light sensing layer disposed on the substrate to receive a light;
   a source electrode disposed on the light sensing layer;
   a drain electrode disposed on the light sensing layer and spaced apart from the source electrode;
   an insulating layer disposed on the source electrode and the drain electrode; and
   a gate electrode disposed on the insulating layer to face the light sensing layer,
   wherein an edge of the gate electrode directly overlaps with the light sensing layer at least in an area where the light sensing layer is overlapped with the source electrode and the drain electrode,
   wherein the source electrode comprises a plurality of first branch electrodes disposed in a first direction and a first body electrode connecting the first branch electrodes, the drain electrode comprises a plurality of second branch electrodes disposed in the first direction and a second body electrode connecting the second branch electrodes, and the first branch electrodes are alternately disposed with the second branch electrodes,
   wherein the gate electrode comprises:
      a contact portion disposed perpendicular to the first direction;
      a first end extending in the first direction and crossing the first branch electrodes: and
      a second end disposed parallel to the first end and crossing the second branch electrodes, and
   wherein the light sensing layer comprises a third end and a fourth end that are disposed substantially parallel to the first end and the second end, respectively.

2. The light sensor of claim 1, wherein a distance between the first end and the second end is shorter than a distance between the third end and the fourth end.

3. The light sensor of claim 1, wherein the third end of the light sensing layer is recessed toward the fourth end in an area between two adjacent first branch electrodes, and the fourth end of the light sensing layer is recessed toward the third end in an area between two adjacent second branch electrodes.

4. The light sensor of claim 1, wherein the gate electrode is disposed on a side of the insulating layer facing away from the substrate.

5. The light sensor of claim 1, further comprising:
   an infrared filter disposed under the light sensing layer and configured to filter light propagating toward the light sensing layer.

6. A display apparatus, comprising:
   a display panel comprising a first substrate and a second substrate facing the first substrate to display an image; and
   a plurality of light sensors to sense light,
   wherein each of the light sensors comprises:
      a light sensing layer disposed on the first substrate or the second substrate to receive the light;
      a source electrode disposed on the light sensing layer;
      a drain electrode disposed on the light sensing layer and spaced apart from the source electrode;
      an insulating layer disposed on the source electrode and the drain electrode; and
      a gate electrode disposed on the insulating layer to face the light sensing layer, and
   wherein an edge of the gate electrode directly overlaps with the light sensing layer at least in an area where the light sensing layer is overlapped with the source electrode and the drain electrode,
   wherein the source electrode comprises a plurality of first branch electrodes disposed in a first direction and a first body electrode connecting the first branch electrodes, the drain electrode comprises a plurality of second branch electrodes disposed in the first direction and a second body electrode connecting the second branch electrodes, and the first branch electrodes are alternately disposed with the second branch electrodes,
   wherein the gate electrode comprises:
      a contact portion disposed perpendicular to the first direction;
      a first end extending in the first direction and crossing the first branch electrodes; and
      a second end disposed parallel to the first end and crossing the second branch electrodes, and
   wherein the light sensing layer comprises a third end and a fourth end that are disposed substantially parallel to the first end and the second end, respectively.

7. The display apparatus of claim 6, wherein a plurality of pixels is disposed on the first substrate, and the plurality of sensors is disposed on the second substrate.

8. The display apparatus of claim 7, further comprising a backlight unit disposed adjacent to the first substrate,
   wherein the backlight unit comprises:
   a first light source configured to provide a first light to the first substrate; and
   a second light source configured to provide a second light to the first substrate.

9. The display apparatus of claim 8, wherein the first light has an infrared wavelength, and the second light is a white light.

10. The display apparatus of claim 6, wherein a distance between the first end and the second end is shorter than a distance between the third end and the fourth end.

11. The display apparatus of claim 6, wherein the third end of the light sensing layer is recessed toward the fourth end in an area between two adjacent first branch electrodes, and the fourth end of the light sensing layer is recessed toward the third end in an area between two adjacent second branch electrodes.

12. The display apparatus of claim 6, wherein the light sensing layer comprises a silicon germanium.

13. The display apparatus of claim 6, wherein the gate electrode is disposed on a side of the insulating layer facing away from the substrate.

14. The display apparatus of claim 6 further comprising:
    an infrared filter disposed under the light sensing layer and configured to filter light propagating toward the light sensing layer.

15. A display apparatus, comprising:
    a display panel to display an image, the display panel comprising:
    a first substrate comprising a plurality of pixels; and
    a second substrate comprising:
       a first sensor to sense a first light comprising an infrared wavelength; and a second sensor to sense a second light comprising a visible wavelength; and a backlight unit disposed adjacent to the display panel to provide a white light to the first substrate, wherein each of the first sensors comprises:

a light sensing layer to receive the first light or the second light;

a source electrode disposed on the light sensing layer;

a drain electrode disposed on the light sensing layer and spaced apart from the source electrode;

an insulating layer disposed on the source electrode and the drain electrode; and a gate electrode disposed on the insulating layer to face the light sensing layer, and wherein an edge of the gate electrode is disposed on the light sensing layer at least in an area where the light sensing layer is overlapped with the source electrode and the drain electrode, wherein the source electrode comprises a plurality of first branch electrodes disposed in a first direction and a first body electrode connecting the first branch electrodes, the drain electrode comprises a plurality of second branch electrodes disposed in the first direction and a second body electrode connecting the second branch electrodes, and the first branch electrodes are alternately disposed with the second branch electrodes, wherein the gate electrode comprises:

a contact portion disposed perpendicular to the first direction;

a first end extending in the first direction and crossing the first branch electrodes; and a second end disposed parallel to the first end and crossing the second branch electrodes, and wherein the light sensing layer comprises a third end and a fourth end that are disposed substantially parallel to the first end and the second end, respectively.

16. The display apparatus of claim 15, wherein a distance between the first end and the second end is shorter than a distance between the third end and the fourth end.

17. The display apparatus of claim 15, wherein the third end of the light sensing layer is recessed toward the fourth end in an area between two adjacent first branch electrodes, and the fourth end of the light sensing layer is recessed toward the third end in an area between two adjacent second branch electrodes.

18. The display apparatus of claim 15, wherein the light sensing layer comprises a silicon germanium.

* * * * *